(12) United States Patent
Kurbanov et al.

(10) Patent No.: US 8,030,829 B1
(45) Date of Patent: Oct. 4, 2011

(54) HYBRID PIEZOELECTRIC COMPOSITES WITH HIGH ELECTROMECHANICAL CHARACTERISTICS

(75) Inventors: Mirza Abdul Oglu Kurbanov, Baku (AZ); Azad Agalar Oglu Bayramov, Baku (AZ); Nuru Arab Oglu Safarov, Baku (AZ); Farida Nasir Gizi Tatardar, Sumgait (AZ); Adil A. Mextili, Baku (AZ); Irada Sultanaxmed Gizi Sultanaxmedova, Baku (AZ)

(73) Assignee: Malaxit Co., Baku (AZ)

( * ) Notice: Subject to any disclaimer, the term of this patent is extended or adjusted under 35 U.S.C. 154(b) by 0 days.

(21) Appl. No.: 12/748,056

(22) Filed: Mar. 26, 2010

(51) Int. Cl.
*H01L 41/187* (2006.01)

(52) U.S. Cl. ........................................................ 310/358

(58) Field of Classification Search .................. 310/358
See application file for complete search history.

(56) References Cited

U.S. PATENT DOCUMENTS

| | | |
|---|---|---|
| 4,128,489 A | 12/1978 | Seo |
| 4,595,515 A * | 6/1986 | Wakino et al. ................. 252/62 |
| 5,169,551 A | 12/1992 | Tsunooka et al. |
| 5,320,910 A | 6/1994 | Banno et al. |
| 5,591,372 A | 1/1997 | Venkataramani et al. |
| 5,796,207 A | 8/1998 | Safari et al. |
| 7,383,621 B2 * | 6/2008 | Sube ............................ 29/25.35 |
| 2007/0138917 A1* | 6/2007 | Schultz et al. ................ 310/358 |
| 2007/0205698 A1* | 9/2007 | Chaggares et al. ........... 310/327 |

FOREIGN PATENT DOCUMENTS

| | | |
|---|---|---|
| EP | 0208019 A2 | 10/1987 |
| JP | S56-6487 A | 1/1981 |
| JP | S57-202789 A | 12/1982 |
| JP | 4-159680 A * | 6/1992 |
| JP | H6-154208 A | 6/1994 |
| KR | 960012732 B1 | 9/1996 |
| LV | 10134 B | 10/1994 |

* cited by examiner

*Primary Examiner* — Thomas Dougherty
(74) *Attorney, Agent, or Firm* — Haynes and Boone, LLP; Pavel I. Pogodin

(57) ABSTRACT

A hybrid piezoelectric composite comprises a layer of a polymer matrix comprising particles of a PZT group in a micro range of dimensions, which is sandwiched between two layers of a polymer matrix comprising particles of a dielectric material in a nano range of dimensions. The materials of both layers are polarized with electrothermal polarization. The polymer matrices of both component composites may comprise high-density polyethylene, polyvinylidene fluoride, polypropylene, or low-density polyethylene. The dielectric material of the first component nanocomposite may be selected from the group consisting of $SiO_2$ and $BaTiO_3$, and the ceramic particles of the second component are made from a piezoelectric ceramic material of a PZT group having a tetragonal structure.

12 Claims, 3 Drawing Sheets

HYBRID PIEZOELECTRIC COMPOSITES WITH HIGH ELECTROMECHANICAL CHARACTERISTICS

FIELD OF THE INVENTION

The present invention relates to hydride piezoelectric composite materials, more particularly to piezoelectric composite materials that are characterized by a high piezoelectric modulus, high modulus of elasticity, high piezoelectric sensitivity, improved piezoelectric coupling coefficient, excellent electromechanical properties, and a wide frequency range in radiation mode. The hydride piezoelectric composite materials of the invention may find application in power-intensive generators of acoustic waves.

BACKGROUND OF THE INVENTION

Piezoelectric composite materials are known in the art. One such known piezoelectric composite material which comprises an acetal resin, a polymer of high dielectric permittivity, and a piezoelectric powder is disclosed in U.S. Pat. No. 4,128,489 issued in 1978 to I. Seo. This piezocomposite material possesses good formability and elasticity. However, it has a relatively low piezoelectric sensitivity, high dielectric losses, and a low electromechanical coefficient of efficiency.

U.S. Pat. No. 5,796,207 issued in 1998 to A. Safari, et al. discloses a piezoelectric composite material which comprises a directionally oriented piezoelectric material built into a polymer. However, such a material is difficult to manufacture. Furthermore, the material has low mechanical strength, is difficult to polarize, has high dielectric losses, and has high acoustic losses on the boundaries of a piezophase with a polymer matrix. Korean Patent KR 960012732 issued to Y. Kwang-Soo, et al., in 1996 discloses another known material of the aforementioned type is a matrix piezoelectric composite material that comprises silane, polyvinylidene fluoride, and a piezoelectric powder. Disadvantages of the given material consist of relatively low piezomodulus, low coefficient of piezoelectric coupling, and insufficient electromechanical properties.

Latvian Patent No. LV10134 issued in 1994 to I. Aboltina, et al. discloses a matrix piezoelectric composite material based on a ceramic material and an organic polymer of polymethacrylate or polybutylmethacrylate. Disadvantages of the given material consist of a relatively low piezomodulus, a low piezoelectric coupling coefficient, and insufficient electromechanical properties that result from losses of the elastic wave energy in a near-surface region of matrix composites.

Also known in the art are oriented piezoelectric ceramic and ceramic/polymer composites disclosed, e.g., in U.S. Pat. No. 5,796,207 issued in 1998 to A. Safari, et al. In these materials, the ceramic piezoelectric phase is oriented at an angle with respect to the direction of applied stress. Such materials are difficult to manufacture and present a problem for polarization.

Another known matrix piezoelectric composite material, which is based on a polymer and a solid $PbTiO_3$—$BiFeO_3$ piezoelectric filler is described in European Patent Application Publication No. EP0208019 (invented by J. Giniewicz, et al., and published in 1987). Disadvantages of this material consist of a relatively low piezomodulus, a low piezoelectric coupling coefficient, and low electromechanical properties. In addition, these composites have high losses of acoustic energy in the near-surface region of the piezoelement.

Japanese Unexamined Patent Application Publication (hereinafter referred to as "Kokai") S57-202789 (invented by Kazuhiko Yamomoto, et al., and published in 1982) discloses a matrix piezoelectric composite material based on various polymers, copolymers, and particles of $PbZrO_3$—$PbTiO_3$ piezoceramics. A problem associated with this material is difficulty in selecting a proper polymer or copolymer for a polymer matrix and high losses of acoustic energy in near-surface region of the piezoelement.

Japanese Kokai S56-6487 (invented by Y. Fujimori, et al., and published in 1981) discloses a matrix piezoelectric composite material comprising a fine inorganic ferroelectric powder, a copolymer of acrylonitrile-butadiene, and a copolymer resin of vinylidene fluoride-ethylene trifluoride. Disadvantages of the given material are complicated manufacturing and polarization of the composite.

Also known is a matrix piezoelectric composite material comprising an organic high polymer and particles of a piezoelectric material disclosed in Japanese Kokai H6-154208 (invented by T. Saito, et al., and published in 1994). Disadvantages of the given material are high losses of acoustic energy that occur in near-surface regions of piezoelement because of the specific matrix structure of the composite.

BRIEF SUMMARY OF INVENTION

The invention provides a hybrid piezoelectric composite, i.e., a piezoelectric material that consists of at least two different component composites, in particular, of a first component nanocomposite that comprises a polymer matrix and a dielectric and a second component micropiezocomosite that comprises a polymer matrix and a piezoceramic material of a PZT group.

As compared to conventional piezoelectric composites, hybrid composites of the present invention possess a number of advantages such as high piezoelectric modulus, high modulus of elasticity, improved piezoelectric sensitivity, high coefficient of piezoelectric coupling, high electromechanical property, and a wider frequency range in a radiation mode. The hybrid piezoelectric composites of the present invention may find use in high-power generators of electroacoustic waves, transceiver acoustic antennas, resonance pressure sensitive elements, microphones, head phones, seismic- and vibration detectors, throat microphones, and various sensors.

The polymer matrices of the first component nanocomposite and the second component micropiezocomposite may be exemplified by high-density polyethylene, polyvinylidene fluoride, polypropylene, and low-density polyethylene. The dielectric of the first component nanocomposite may comprise metal oxides such as $SiO_2$, and $BaTiO_3$, and a piezoceramic material of the second component nanocomposite comprises a piezoelectric ceramic material of a PZT type having a tetragonal structure.

DETAILED DESCRIPTION OF THE INVENTION

In general, a hybrid piezoelectric composite, i.e., a piezoelectric material that consists of at least two different component composites, in particular, of a first component nanocomposite that comprises a polymer matrix and a dielectric material in a nano range of dimensions, e.g., a metal oxide, and a second component micropiezocomosite that comprises a polymer matrix and a piezoceramic material of a PZT group in a micro range of dimensions.

The polymer matrices of the first component nanocomposite and the second component micropiezocomposite may be exemplified by a high-density polyethylene and a polyvinylidene fluoride. The metal oxide of the first component nanocomposite may comprise $SiO_2$ and $BaTiO_3$.

According to one aspect of the invention, a hybrid piezoelectric composite comprises a first component nanocomposite that consists of a polyolefin matrix and a metal oxide and a second component micropiezocomposite that comprises a polyolefin matrix and a piezoceramic material. In the first component nanocomposite and in the micropiezocomposite, the polyolefin matrices of this aspect may comprise a high-density polyethylene or a polypropylene. In the second component micropiezocomposite, the piezoceramic material may be represented by a piezoceramic material of PZT group.

According to another aspect of the invention, a hybrid piezoelectric composite comprises a first component nanocomposite that consists of a polyvinylydenefluoride matrix and a metal oxide and a second component micropiezocomposite that comprises of a polyvinylydenefluoride matrix and a piezoceramic material. In the first component nanocomposite, the metal oxide may be represented by $SiO_2$ or $BaTiO_3$. In this aspect, the piezoceramics of the second component micropiezocomposite may be represented by a piezoceramics of a piezoelectric group (PZT).

According to a third aspect of the invention, the polymer matrices of the first component nanocomposite and the second component micropiezocomposite may be selected from high-density polyethylene, polyvinylidene fluoride, polypropylene, and low-density polyethylene; and the dielectric of the first component nanocomposite may comprise a compound selected from $SiO_2$, and $BaTiO_3$, and a piezoceramic material of the second component may be a piezoelectric ceramic of a PZT-8 group having a tetragonal structure.

The hybrid piezoelectric composite of the invention may be manufactured in several main stages.

Figure 1:
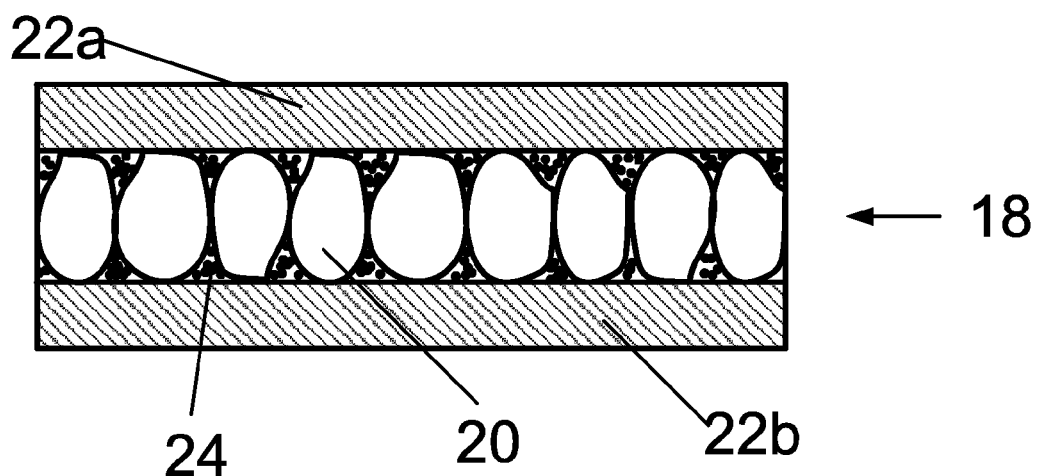
FIG. 1 is a sectional view of a composite element obtained after the first stage of the hybrid composite production at which a composite element is obtained with near-surface polymer phases on both sides.

In a first stage, a composite element 18 shown in FIG. 1 may be produced by hot pressing. This composite element 18 may have on both sides near-surface polymer phases 22a and 22b. Then the composite element is polarized by a first electrothermal polarization, e.g., by retaining it for a predetermined time, e.g., 0.5 hours, in an electric field of a predetermined intensity, e.g., $E_p=5$ MV, at a predetermined polarization temperature, e.g., 393 K. It can be seen from FIG. 1 that the composite obtained after the first stage may comprise particles 20 of piezoelectric material of a PZT group embedded in the polymer matrix and sandwiched between the aforementioned two near-surface polymer phases 22a and 22b, such as high-density polyethylene, polyvinylidene fluoride, polypropylene, or a low-density polyethylene.

Figure 2:
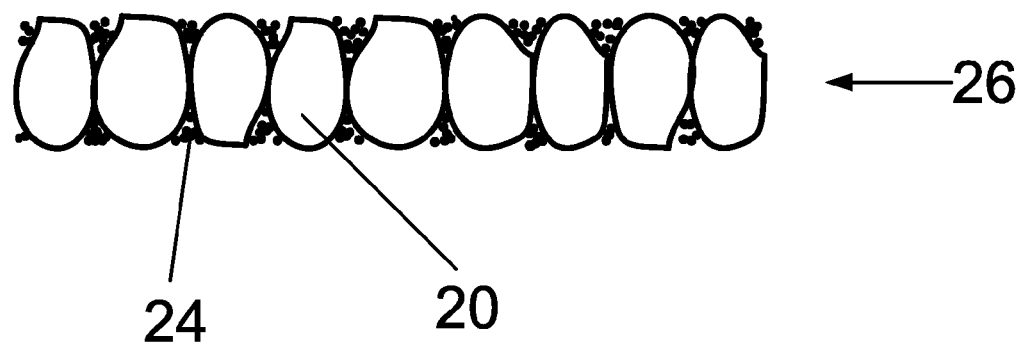
FIG. 2 is a sectional view of a composite element of FIG. 1 after removal of the near-surface polymer phases on both sides.

In a second stage, the near-surface polymer phases 22a and 22b of the composite element 18 are dissolved without destroying a system of a polymer 24 and the piezoelectric particles 20. Toluene is one solvent that may be used for this purpose. The piezoelectric particles 20 have dimensions ranging from 100 μm to 250 μm. As a result, a piezoelectric element 26 shown in FIG. 2 is formed.

Figure 3:
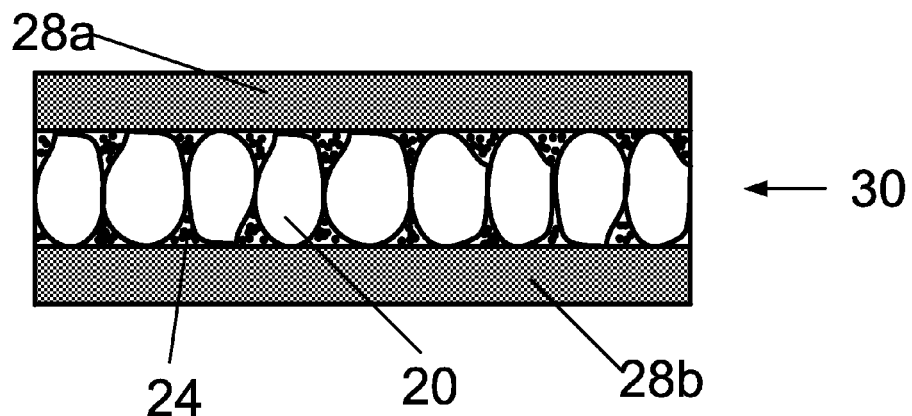
FIG. 3 is a view of the final hybrid piezoelectrical composite of the invention.

A third stage comprises introduction of BaTi or $SiO_2$ nanoparticles into the dissolved polymer. The solvent may be exemplified by toluene and the polymer may be exemplified by high-density polyethylene, polyvinylidene fluoride, polypropylene, and low-density polyethylene. The nanoparticles of BaTi, $SiO_2$, or piezoceramic material PZT-8 having a tetragonal structure have dimensions ranging from 20 nm to 100 nm. The composite with nanoparticles formed in this stage may then be applied by a method of chemical deposition onto the opposite sides of the piezoelectric element 26 for forming composite near surface layers 28a and 28b which are shown in FIG. 3. A polymer of the obtained pre-product may be subjected to a second electrothermal polarization, whereby a final nanohybrid piezocomposite material 30 (FIG. 3) that possesses piezoelectric properties is produced. Similar to the first electrothermal polarization, the process comprises retaining, this time the piezoelectric element 26, for a predetermined time, e.g., 0.5 hours, in an electric field of a predetermined intensity, e.g., $E_p=5$ MV, at a predetermined polarization temperature, e.g., 393 K.

Figure 4:
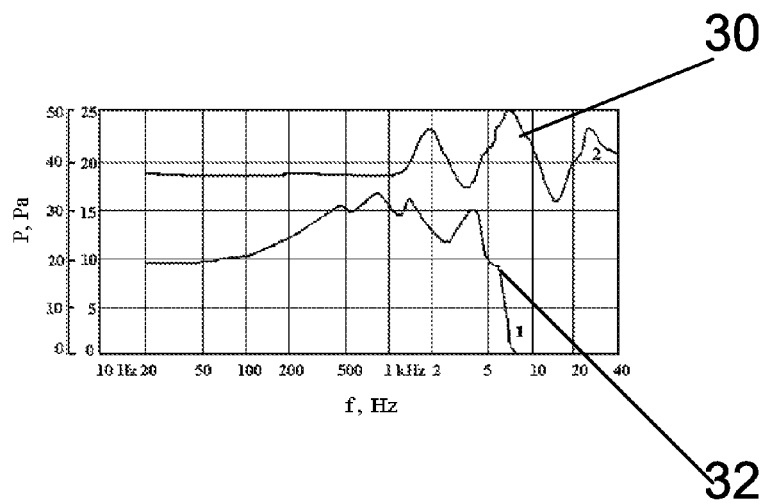
FIG. 4 is a graph that illustrates a frequency dependence of an output signal power of a transducer based on a nanohybrid piezocomposite of the invention.

FIG. 4 is a graph that illustrates a frequency dependence of an output signal power of a transducer based on a nanohybrid piezocomposite of the invention (curve 30 on the 0-50 Pa scale) and of a transducer based on a micropiezoelectric composite (curve 32 on the 0-25 Pa scale of the ordinate axis; the frequency is plotted on the abscissa axis). These results show that the transducer based on the hybrid nano-micropiezoelectric composite has a wider frequency range and a greater power of the output signal.

Figure 5:
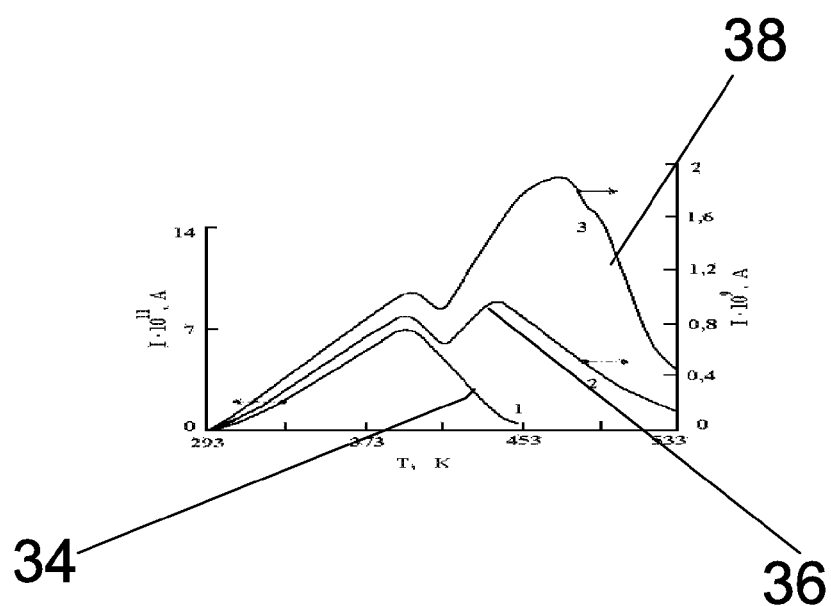
FIG. 5 is a graph that shows spectra of thermally stimulated depolarizing currents measured in the nanohybrid piezocomposite of the invention.

A specimen of a composite material based on a high-density polyethylene and a PZT ceramic was made by hot pressing. Then, the specimen was polarized, and spectra of thermally stimulated depolarizing currents were measured. The results are shown in FIG. 5 where currents I are plotted on the ordinate axis, and temperature) (K°) are plotted on the abscissa axis. Three curves 34, 36, and 38 are shown in the graph of FIG. 5. Curve 34 corresponds to a high-density polyethylene that was subjected to thermally stimulated depolarization, curve 36 corresponds to thermally crystallized composite that was subjected to thermally stimulated depolarization, and curve 38 corresponds to the case of thermally stimulated depolarization of a composite crystallized under conditions of electric discharge plasma and high temperature.

It can be seen that each curve of FIG. 5 has two maximums of the current. The first maximum corresponds to the melting point of the initial polymer phase. The second maximum corresponds to the melting point of a polymer interfacial phase formed under the influence of the surface of micropiezoelectric particles. These maximums allowed selection of the temperature at which the near-surface polymer layer of piezoelement can be dissolved in a toluene medium.

The invention will be further described by way of practical examples.

Example 1

A sample of a composite based on high-density polyethylene and a piezoelectric material of a PZT ceramic type was produced by hot pressing. The sample was polarized for 0.5 hours in an electric field having $E_p=5$ MV/m intensity at a polarization temperature of 393 K. The temperature at which the polymer layer of piezoelement was dissolved ranged from 373 to 413 K. After the near-surface layer of piezoelement was dissolved, dielectric nanoparticles of $BaTiO_3$ or $SiO_2$ were introduced into the solution. Volume contents of the polymer matrix, piezoelectric phase, and nanophase of the composite were 49 vol. %, 50 vol. %, and 0.25 to 1 vol. %, respectively. As a result, a sample in the form of a piezoelectrical element was obtained.

The following step was a process of chemical deposition of nanostructured solution on the surface of the obtained piezoelement with emission of a toluene fraction. In the last stage, the sample again was polarized for 0.5 hours in an electric field having $E_p=5$ MV/m intensity at a polarization temperature of 393 K. The obtained product comprised a hybrid of matrix-type polymer composite consisting of a first component nanocomposite that consisted of a polymer matrix and a metal oxide and a second component micropiezocomposite that consisted of a polyolefin matrix and a piezoceramic material.

Parameters of hybrid piezoelectric composites produced with different contents of high-density polyethylenes, dielectrics, and a piezoceramics of PZT-5H type are shown in Table 1.

Parameters of hybrid piezoelectric composite were compared with parameters of micropiezoelectric composites. The PZT-piezoceramic material with tetragonal structure was chosen as the micropiezophase.

Comparative parameters of matrix micropiezoelectric composites and matrix hybrid nano- and micropiezoelectric composites are shown in Table 1.

TABLE 1

| Parameters | High-density polyethylene - 50% vol. PZT-5H micropiezocomposite | High-density polyethylene - 0.4 vol. $SiO_2$-49.6 vol. % PZT-5H hybrid piezocomposite |
| --- | --- | --- |
| $\epsilon_{33}/\epsilon_0$ | 100 | 140 |
| $\kappa_{31}$ | 0.15 | 0.22 |
| $\kappa_{33}$ | 0.25 | 0.38 |
| $d_{31} \cdot 10^{12}$, C/N | 50 | 80 |
| $d_{33} \cdot 10^{12}$, C/N | 89 | 150 |
| $Q_m$ | 16 | 96 |
| $Y \cdot 10^{-10}$, Pa | 1.6 | 8.6 |
| $tg\delta \cdot 10^2$; $E = 5 \cdot 10^3$ V/m | 0.145 | 0.06 |
| $(d_{31}Y)^2$, $(C/m^2)^2$ | 0.64 | 47.5 |
| $K^2_{31} \cdot Q_m$ | 0.36 | 4.7 |
| $K^2_{33}/tg\delta$ | 43 | 240 |
| $K^2_{31} \cdot Q_m \cdot \epsilon_{33}/\epsilon_0$ | 36 | 658 |
| Diameter of piezoelement, $10^{-3}$ m | 20 | 20 |
| Thickness of piezoelement, $10^{-6}$ m | 250 | 250 |
| Diameter of piezoparticles, $10^{-6}$ m | 160-200 | 160-200 |
| Diameter of nanoparticles, $10^{-9}$ m | — | 50-70 |
| Structure of piezophase | Tetragonal | Tetragonal |
| Structure of $SiO_2$ nanoparticles | — | Amorphous |

The parameters shown in Table one have the following meanings:

$\epsilon_{33}$—relative dielectric constant
$\epsilon_0$—permittivity
$K_{31}$—piezoelectric coupling coefficient (longitudinal)
$K_{33}$—piezoelectric coupling coefficient (transversal)
$d_{31}$—piezomodulus (longitudinal)
$d_{33}$—piezomodulus (transversal)
$Q_m$—mechanical Q
Y—Young modulus
tgδ—dielectric loss
E—electric field intensity Example 2

A semi-product composite material comprising 49 vol. % of polyvinylidene fluoride and a 50.% piezoelectric material of PZT ceramics with 0.25 to 1 vol. % of $SiO_2$ nanoparticles and a hybrid piezoelectric composite material were produced by the same method as described in Example 1. Parameters of the obtained hybrid composite are shown in Table 2. The microphase had a PZT rhombohedral structure. Designations to the parameters of Table 2 are the same as to Table 1.

TABLE 2

| Parameters | polyvinylidene fluoride - 50 vol. % PZT-5H micropiezocomposite | polyvinylidene fluoride - 0.4 vol. $SiO_2$-49.6 vol. % PZT-5H hybrid piezocomposite |
| --- | --- | --- |
| $\epsilon_{33}/\epsilon_0$ | 110 | 135 |
| $\kappa_{31}$ | 0.16 | 0.26 |
| $\kappa_{33}$ | 0.28 | 0.49 |
| $d_{31} \cdot 10^{12}$, C/N | 55 | 87 |
| $d_{33} \cdot 10^{12}$, C/N | 108 | 170 |
| $Q_m$ | 18 | 100 |
| $Y \cdot 10^{-10}$, Pa | 2.3 | 9.5 |
| $tg\delta \cdot 10^2$; $E = 5 \cdot 10^3$ V/m | 0.16 | 0.07 |
| $(d_{31}Y)^2$, $(C/m^2)^2$ | 1.6 | 68.3 |
| $K^2_{31} \cdot Q_m$ | 0.46 | 6.76 |
| $K^2_{33}/tg\delta$ | 49 | 343 |
| $K^2_{31} \cdot Q_m \cdot \epsilon_{33}/\epsilon_0$ | 50.6 | 912 |
| Diameter of piezoelement, $10^{-3}$ m | 20 | 20 |
| Thickness of piezoelement, $10^{-6}$ m | 250 | 250 |
| Diameter of piezoparticles, $10^{-6}$ m | — | 160-200 |
| Diameter of nanoparticles, $10^{-9}$ m | 50-70 | 50-70 |
| Structure of piezophase | rhombohedral | rhombohedral |
| Structure of $SiO_2$ nanoparticles | — | Amorphous |

Example 3

A semi-product composite material comprising 49 vol. % of high-density polyethylene, a 50% of piezoelectric material of PZT ceramic, and 0.25 to 1 vol. % of $SiO_2$ nanoparticles and a hybrid piezoelectric material were produced by the same method as in Example 1. Parameters of obtained hybrid composite are shown in Table 3. The micropiezophase had a PZT rhombohedral structure. Designations to the parameters of Table 3 are the same as those of Table 1.

TABLE 3

| Parameters | High-density polyethylene - 50 vol. % PZT-5A micropiezocomposite | High-density polyethylene - 0.4 vol. $SiO_2$-49.6 vol. % PZT-5A hybrid piezocomposite |
| --- | --- | --- |
| $\epsilon_{33}/\epsilon_0$ | 89 | 128 |
| $\kappa_{31}$ | 0.16 | 0.25 |
| $\kappa_{33}$ | 0.26 | 0.40 |
| $d_{31} \cdot 10^{12}$, C/N | 62 | 70 |
| $d_{33} \cdot 10^{12}$, C/N | 120 | 142 |
| $Q_m$ | 25 | 130 |
| $Y \cdot 10^{-10}$, Pa | 1.5 | 8.0 |
| $tg\delta \cdot 10^2$; $E = 5 \cdot 10^3$ V/m | 0.12 | 0.06 |

TABLE 3-continued

| Parameters | High-density polyethylene - 50 vol. % PZT-5A micropiezocomposite | High-density polyethylene - 0.4 vol. $SiO_2$-49.6 vol. % PZT-5A hybrid piezocomposite |
|---|---|---|
| $(d_{31}Y)^2$, $(C/m^2)^2$ | 0.865 | 31.36 |
| $K^2_{31} \cdot Q_m$ | 0.64 | 8.125 |
| $K^2_{33}/tg\delta$ | 56.3 | 266.7 |
| $K^2_{31} \cdot Q_m \cdot \epsilon_{33}/\epsilon_0$ | 57 | 1040 |
| Diameter of piezoelement, $10^{-3}$ m | 20 | 20 |
| Thickness of piezoelement, $10^{-6}$ m | 250 | 250 |
| Diameter of piezoparticles, $10^{-6}$ m | 160-200 | 160-200 |
| Diameter of nano[articles, $10^{-9}$ m | — | 50-70 |
| Structure of piezophase | rhombohedral | rhombohedral |
| Structure of $SiO_2$ nanoparticles | — | Amorphous |

Although the invention has been shown and described with reference to specific embodiments, it is understood that these embodiments should not be construed as limiting the areas of application of the invention and that any changes and modifications are possible provided that these changes and modifications do not depart from the scope of the attached patent claims. For example, although exact polarization temperature and intensity of electric field are indicated for electrothermal polarization of the composite materials, the temperature, treatment time, and electric field intensity may be different depending on specific conditions. Polymers, dielectric materials, and ceramic particles may also be different from those indicated in the examples. Another example, solvents other than toluene may be used for dissolving the near-surface polymer phases.

The invention claimed is:

1. A hybrid piezoelectric composite comprising at least two different component composites, wherein at least one component composite has a polymer matrix comprising particles of a dielectric material in a nano range of dimensions and at least another component composite has a polymer matrix comprising ceramic particles of a PZT group in a micro range of dimensions.

2. The hybrid piezoelectric composite of claim 1, wherein the at least one component composite is a first component nanocomposite, and the least another component composite is a second component micropiezocomposite, wherein the polymer matrix of the first component nanocomposite comprises a polymer selected from the group consisting of polyolefin and polyvinylydenefluoride.

3. The hybrid piezoelectric composite of claim 2, wherein the polyolefin is selected from the group consisting of a high-density polyethylene and polypropylene.

4. The hybrid piezoelectric composite of claim 1, wherein the dielectric material comprises a metal oxide.

5. The hybrid piezoelectric composite of claim 4, wherein the metal oxide is selected from the group consisting of $SiO_2$ and $BaTiO_3$.

6. The hybrid piezoelectric composite of claim 2, wherein the dielectric material comprises a metal oxide.

7. The hybrid piezoelectric composite of claim 6, wherein the metal oxide is selected from the group consisting of $SiO_2$ and $BaTiO_3$.

8. The hybrid piezoelectric composite of claim 1, wherein the particles of a dielectric material have dimensions in the range of 20 nm to 100 nm and the particles of piezoelectric particles have dimensions in the range of 100 μm to 250 μm.

9. The hybrid piezoelectric composite of claim 1, wherein the ceramic particles of the PZT group have a structure selected from the group consisting of a rhombohedral structure and a tetragonal structure.

10. The hybrid piezoelectric composite of claim 2, wherein the polymer matrix of the first component nanocomposite comprises a polymer selected from the groups consisting of polyolefin and polyvinylidenefluoride.

11. The hybrid piezoelectric composite of claim 10, wherein the polyolefin is selected from the group consisting of a high-density polyethylene and polypropylene.

12. The hybrid piezoelectric composite of claim 2, wherein the polymer matrices of the first component nanocomposite and of the second component micropiezocomposite is selected from the group consisting of high-density polyethylene, polyvinylidene fluoride, polypropylene, and low-density polyethylene, wherein the dielectric material of the first component nanocomposite is selected from the group consisting of $SiO_2$ and $BaTiO_3$, and wherein the ceramic material of the second component micropiezocomposite that comprises a piezoelectric ceramic material of the PZT group comprises particles having a tetragonal structure.

* * * * *